United States Patent [19]
Giles et al.

[11] Patent Number: 5,369,752
[45] Date of Patent: Nov. 29, 1994

[54] METHOD AND APPARATUS FOR SHIFTING DATA IN AN ARRAY OF STORAGE ELEMENTS IN A DATA PROCESSING SYSTEM

[75] Inventors: Grady L. Giles; William D. Atwell, Jr.; Jesse R. Wilson, all of Austin; Richard B. Reis, Garland, all of Tex.

[73] Assignee: Motorola, Inc., Schaumburg, Ill.

[21] Appl. No.: 891,241

[22] Filed: Jun. 1, 1992

[51] Int. Cl.$^5$ ............................................. G06F 12/02
[52] U.S. Cl. ........................... 395/425; 364/DIG. 1; 364/244.5
[58] Field of Search .................. 395/400, 425; 364/200 MS File, 900 MS File

[56] References Cited

U.S. PATENT DOCUMENTS

| | | | |
|---|---|---|---|
| 4,733,405 | 3/1988 | Shimizume et al. | 377/29 |
| 4,827,476 | 5/1989 | Garcia | 371/22.3 |
| 4,852,061 | 7/1989 | Baron et al. | 365/154 |
| 4,876,704 | 10/1989 | Ozaki | 377/70 |
| 4,897,838 | 1/1990 | Tateishi | 371/22.3 |

OTHER PUBLICATIONS

Eytan Hartung, Mike Gladden and Oded Yishay, "A Dual Pass Scan Mechanism for Minimizing Serial Scan Outputs", Jul. 1981, Motorola Technical Developements, vol. 13, pp. 14–15.
J. Lyon, M. Gladden, E. Hartung, E. Hoang, and K. Raghunathan, "Testability Features of the 68HC16Z1", 1991 IEEE Intl. Test Conference on Oct. 28, 1991; submitted after Jul. 16, 1991; pp. 5–6.
Dilip K. Bhavsar, "A New Economical Implementation for Scannable Flip-Flops in MOS", Jun. 1986, IEEE Design & Test, pp. 52–56.
Grady Giles, "Scan Path to Inject or Read Out Microcode", Oct. 1985, Motorola Technical Developments, vol. 5, p. 53.

Primary Examiner—Joseph L. Dixon
Assistant Examiner—Hiep Nguyen
Attorney, Agent, or Firm—Susan C. Hill

[57] ABSTRACT

A method and apparatus for shifting data in an array of storage elements (22–37) in a data processing system (10). In one form, the present invention uses multiplexer (MUX) logic (38) and Shift Control signals to selectively couple storage elements (22–37) to latches (39–42). In this manner, data values can be serially scanned into and out of the array for test purposes without requiring a duplicate set of latches. The MUX logic 38 couples one storage element (22–37) to each latch (39–42). Then MUX logic 38 decouples those storage elements (22–37). Next, MUX logic 38 couples an adjacent storage element (22–37) to each latch (39–42). In this manner, the storage elements (22–37) in one row and the latches (39–42) mimic the functionality of a shift register.

19 Claims, 2 Drawing Sheets

METHOD AND APPARATUS FOR SHIFTING DATA IN AN ARRAY OF STORAGE ELEMENTS IN A DATA PROCESSING SYSTEM

FIELD OF THE INVENTION

The present invention relates in general to data processing systems, and more particularly to shifting data in an array of storage elements in a data processing system.

BACKGROUND OF THE INVENTION

It is very important to improve the quality and reliability of microprocessor integrated circuits. One way to do this is to separately test each individual block of circuitry within the microprocessor, in addition to testing the functionality of the microprocessor as a whole.

An array of storage elements, such as memory cells or register cells, is a common block of circuitry found in most microprocessors. Instruction, data, and address caches are examples of common types of arrays used in microprocessors. Also, some of today's microprocessors use an array of storage elements to store control information. An example of such an array is a control RAM (Random Access Memory), also called a microram. The data values output from the microram are used to control other circuitry within the microprocessor. Often a microram is embedded so deeply within the microprocessor circuitry that the microram does not have a data path that allows the contents of the microram to be transmitted external to the microprocessor. Thus it may be very difficult to properly test the functionality of the microram separate from the functionality of other circuitry within the microprocessor.

As a result, some of today's microprocessors use a serial scan path in order to test an array of storage elements. A serial scan path allows the array to be tested independent of surrounding blocks of circuitry. A serial scan path is a serial data path that can be used both to shift data values into and shift data values out of the array of storage elements. For example, a serial scan path can be used to initialize an array of storage elements by serially shifting in the desired initial values. Likewise, a serial scan path can be used to verify the contents of an array of storage elements by serially shifting out the values presently residing in the array.

For normal operation, most arrays of storage elements require output latches which are used when outputting data values from the array. Note that each data value stored in the array may consist of one or more binary bits. Generally, there is one output latch for each bit of the data value. So when a data value is read out of the array, one latch is required to store each bit of the data value. In some prior art devices, scan testing of the array required one additional output latch for each bit of the data value. Some prior art devices required an extra latch for each storage element in the array in order to allow scan testing of associated combinational logic.

Some prior art devices using scan testing required the implementation of both a master latch and a slave latch which were linked together in order to form a serial shift register. Thus in order to perform scan testing on an array, an extra latch circuit was required for each parallel output bit of the array. Because microrams often have one hundred or more parallel outputs, that meant that one hundred or more extra latch circuits were required in order to implement scan testing of some arrays. Thus scan testing sometimes required a significant amount of extra semiconductor area for latch circuitry that was only used during testing.

SUMMARY OF THE INVENTION

The previously mentioned needs are fulfilled and other advantages achieved with the present invention. In one form, the present invention is an apparatus and a method for shifting data in an array of storage elements in a data processing system. In one embodiment, the data processing system has an array of storage elements arranged in a first plurality of rows and a second plurality of columns. The array of storage elements has a first storage element storing a first value and has a second storage element. The data processing system has latching logic for receiving the first value and for storing the first value. The data processing system also has logic for coupling the first storage element to the latching logic, for transferring the first value to the latching logic, for coupling the second storage element to the latching logic, and for transferring the first value to the second storage element.

The present invention will be understood by one skilled in the art from the detailed description below in conjunction with the accompanying drawings.

DESCRIPTION OF THE PREFERRED EMBODIMENT

The terms "assert" and "negate" will be used when referring to the rendering of a signal, status bit, or similar apparatus into its logically true or logically false state, respectively.

The present invention allows scan testing to be performed on an array of storage elements without the necessity of using an extra latch circuit for each parallel output bit of the array. The present invention thus requires only one latch circuit per output bit, instead of two latch circuits per output bit. The present invention also allows greater flexibility in testing because of the flexibility added by the multiplexer logic.

The present invention uses the storage elements in any one particular row of the array to replace the extra set of output latches. The multiplexer logic allows the storage elements in any one particular row of the array, in combination with the single set of pre-existing output latches, to mimic the functionality of a serial shift register in order to perform scan testing. A data value is loaded into the output latches in the normal parallel manner. That is, the bit value in each storage element is loaded into its corresponding output latch. The multiplexer logic then links each output latch to the adjacent storage element and loads the bit values from the output latches back into the adjacent storage elements.

The storage elements once again contain the bit values, only the bit values have been shifted by one bit. This process is then repeated until all of the bit values have been shifted out of the scan output. The output latches are thus used to temporarily store the bit values during the shifting process. And because the storage elements continue to be used for storing bit values, an extra set of output latches is not required.

Figure 1:
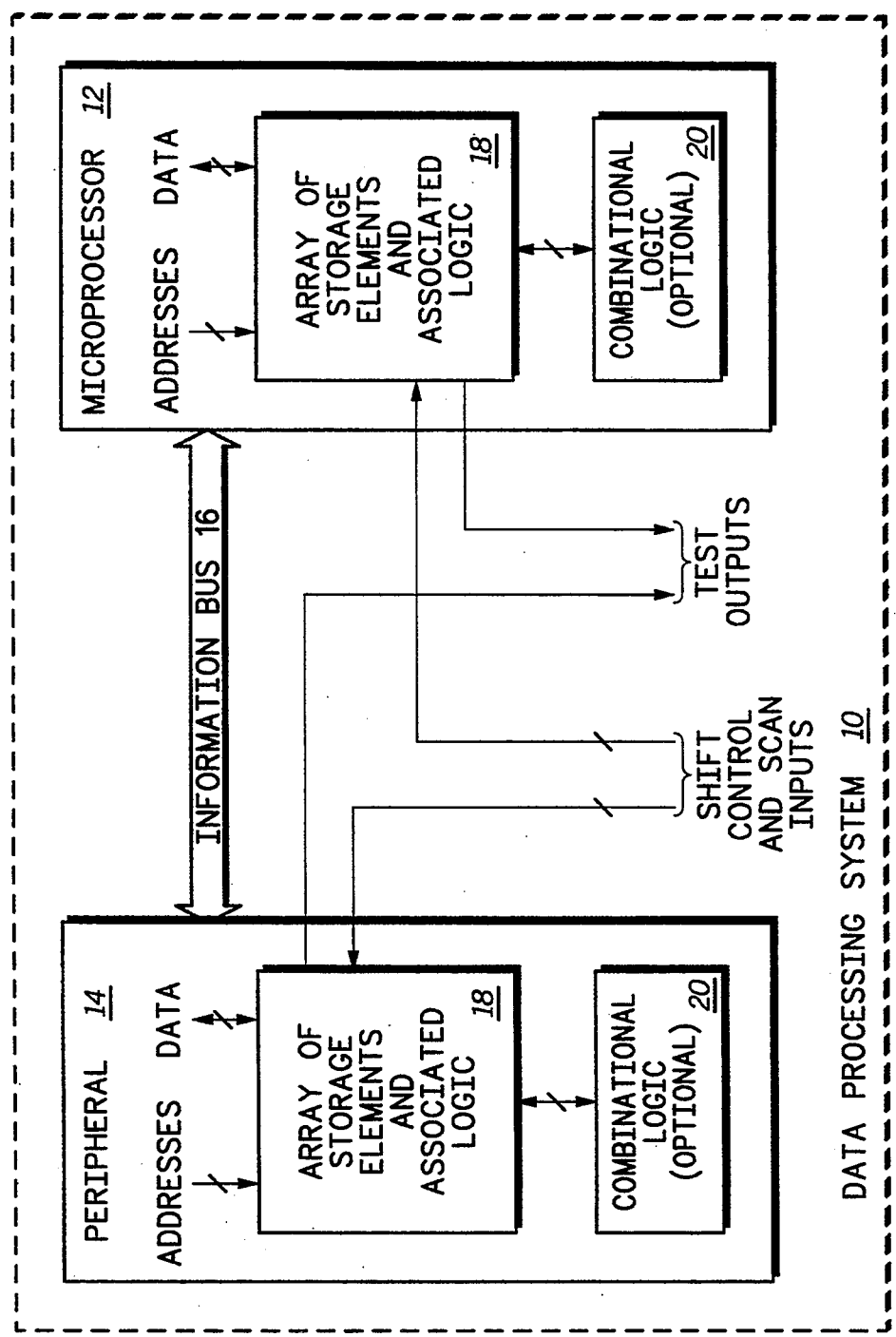
FIG. 1 illustrates, in block diagram form, a data processing system in accordance with one embodiment of the present invention.

FIG. 1 illustrates a data processing system 10 having a microprocessor 12 and a peripheral 14 which are bi-directionally coupled across an information bus 16. Information bus 16 can be used to transfer any type of information, for example, address, data, and control information.

Microprocessor 12 has an array of storage elements and associated logic 18. The array of storage elements and associated logic 18 may be bi-directionally coupled to optional combinational logic 20. The array of storage elements and associated logic 18 receives Shift Control and Scan Input signals, address signals, and data signals. These input signals may be generated internally by microprocessor 12, or they may be generated external to microprocessor 12. If they are generated externally, these input signals may be received across information bus 16, or they may be received separate from information bus 16, as illustrated. Note that elements 18 and 20 are not the only elements of microprocessor 12, but are illustrated merely for the purpose of explaining the invention.

The array of storage elements and associated logic 18 provides data output signals and one or more test output signals called Test Output. Test Output is usually provided external to microprocessor 12 for testing purposes, but some embodiments of the present invention may only use the Test Output signal internally within microprocessor 12.

Peripheral 14 has an array of storage elements and associated logic 18. The array of storage elements and associated logic 18 may be bi-directionally coupled to optional combinational logic 20. The array of storage elements and associated logic 18 receives Shift Control and Scan Input signals, address signals, and data signals. These input signals may be generated internally by peripheral 14, or they may be generated external to peripheral 14. If they are generated externally, these input signals may be received across information bus 16, or they may be received separate from information bus 16, as illustrated. Note that peripheral 14 may have only one element, namely element 18, or peripheral 14 may have other elements (not shown) in addition to elements 18 and 20. Elements 18 and 20 alone are illustrated in peripheral 14 merely for the purpose of explaining the invention.

The array of storage elements and associated logic 18 provides data output signals and one or more test output signals called Test Output. Test Output is usually provided external to peripheral 14 for testing purposes, but some embodiments of the present invention may only use the Test Output signal internally within peripheral 14.

Figure 2:
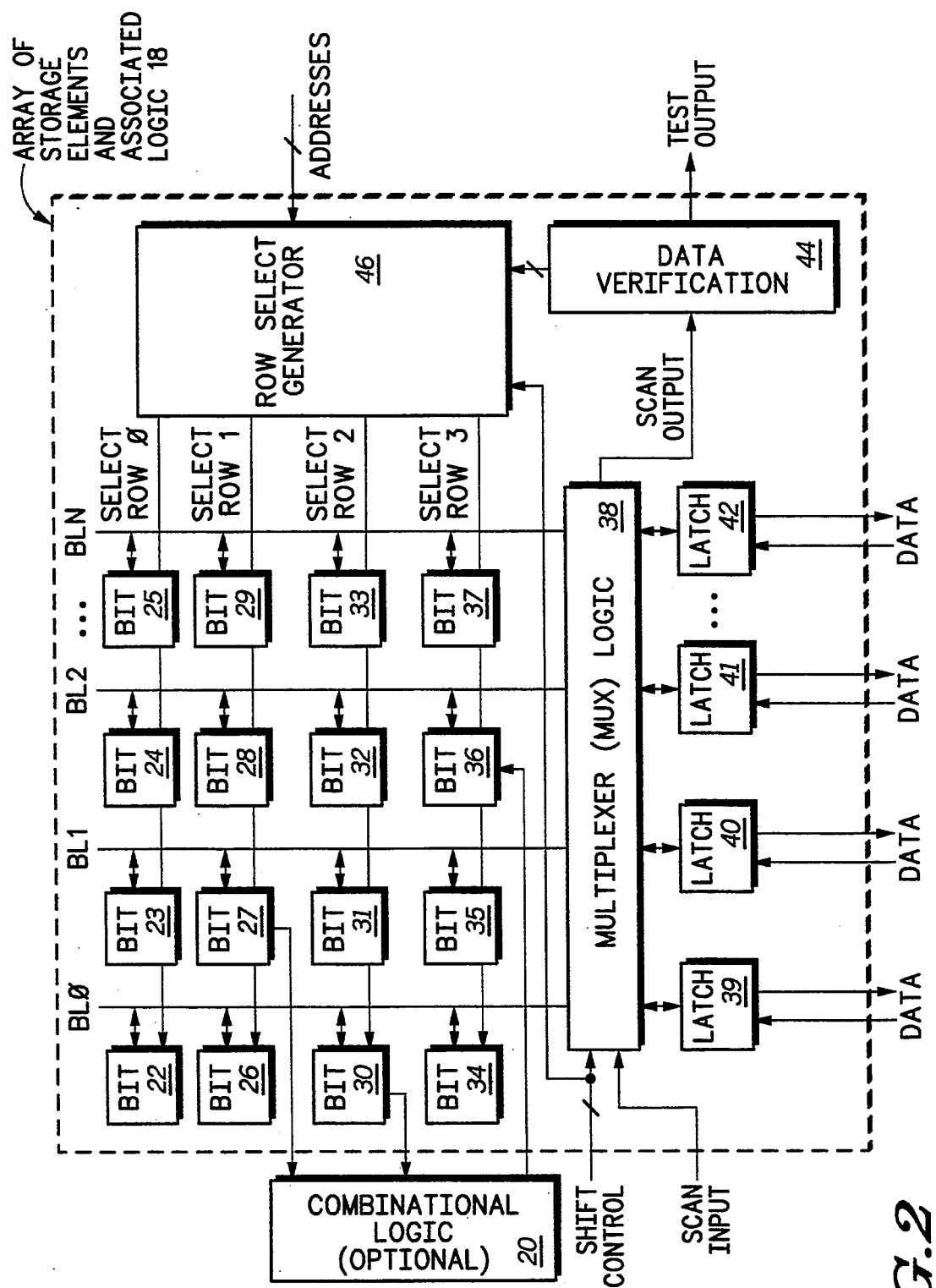
FIG. 2 illustrates, in block diagram form, an array of storage elements and associated logic of FIG. 1 in accordance with one embodiment of the present invention.

FIG. 2 illustrates, in block diagram form, an array of storage elements and associated logic of FIG. 1 in accordance with one embodiment of the present invention. Storage elements or bits 22-37 form an array of storage elements arranged in rows and columns. Although each row of storage elements 22-37 is illustrated using four storage elements, more or less storage elements could be included in each row. In addition, although only four rows are illustrated, other embodiments of the present invention may use any number of rows.

In most applications, storage elements or bits 22-37 are all identical circuits that are capable of storing one binary value or bit of information, namely a binary zero or a binary one. Storage elements 22-25 are part of row 0 and receive the Select Row 0 signal. Storage elements 26-29 are part of row 1 and receive the Select Row 1 signal. Storage elements 30-33 are part of row 2 and receive the Select Row 2 signal. Storage elements 34-37 are part of row 3 and receive the Select Row 3 signal. The Select Row signals determine which row of storage elements 22-37 is coupled to the bit lines.

Storage elements 22, 26, 30, and 34 are bi-directionally coupled to multiplexer (MUX) logic 38 across a conductor or bit line 0 (BL0). Storage elements 23, 27, 31, and 35 are bi-directionally coupled to MUX logic 38 across a conductor or bit line 1 (BL1). Storage elements 24, 28, 32, and 36 are bi-directionally coupled to MUX logic 38 across a conductor or bit line 2 (BL2). Storage elements 25, 29, 33, and 37 are bi-directionally coupled to MUX logic 38 across a conductor or bit line N (BLN).

The storage elements coupled to the same bit line or the same pair of dual bit lines form a column in the array. Thus storage elements 22, 26, 30, and 34 form a column; storage elements 23, 27, 31, and 35 form a column; storage elements 24, 28, 32, and 36 form a column; and storage elements 25, 29, 33, and 37 form a column. Although only four columns are illustrated, other embodiments of the present invention may use any number of columns.

MUX logic 38 is bi-directionally coupled to latches 39-42. Each latch of latches 39-42 is capable of storing one binary value or bit of information, namely a binary zero or a binary one. Each latch of latches 39-42 has a data input path and a data output path labeled DATA. These data paths allow latches 39-42 to be read and written in parallel. MUX logic 38 receives a Scan Input signal and provides a Scan Output signal. In an alternate embodiment of the present invention, the Scan Input and Scan Output signals could be bi-directional so that the Scan Input could be received at either end of MUX logic 38. If Scan Input and Scan Output were bi-directional, both Scan Input and Scan Output would be coupled to data verification logic 44 and would be capable of receiving input values. MUX logic 38 also receives Shift Control signals as inputs.

In an alternate embodiment of the present invention, the single bit lines (BL0-BLN) could be replaced by dual bit lines, and the latches 39-42 could be replaced by sense amplifiers that were able to latch or temporarily store a data value.

Data verification logic 44 receives the Scan Output signal from MUX logic 38 and generates a Test Output signal. Data verification logic 44 is also coupled to a row select generator 46. Row select generator 46 receives address signals and Shift Control signals, in addition to the signals from the data verification logic. Row select generator 46 generates the row select signals.

In the present embodiment, optional combinational logic 20 is illustrated as receiving a signal from storage element 27, as receiving a signal from storage element 30, and as providing a signal to storage element 36. In other embodiments of the present invention, any number and any combination of storage elements 22-37 could receive and provide signals to or from combinational logic 20.

In order to more readily understand the present invention, a brief illustrative example will now be described. The following example uses a common scan testing approach. For purposes of illustration, MUX logic 38 will be assumed to be implemented as a set of N two-to-one multiplexers which only multiplex when bit values are output from latches 39–42 to storage elements 22–37. The bit values stored in one selected row, row 1 in this example, will be scanned out one bit at a time using the Scan Output signal.

As the first step, the bit values stored in row 1, namely the bit values stored in storage elements 26–29, are read into latches 39–42, as follows. The Shift Control signals direct the row select generator 46 to assert the Select Row 1 signal. The Shift Control signals also direct MUX logic 38 to couple each latch 39–42 to its corresponding bit line. Bit 26 is now coupled to latch 39 and the bit value stored in bit 26 is copied into latch 39. Bit 27 is now coupled to latch 40 and the bit value stored in bit 27 is copied into latch 40. Bit 28 is now coupled to latch 41 and the bit value stored in bit 28 is copied into latch 41. Bit 29 is now coupled to latch 42 and the bit value stored in bit 29 is copied into latch 42.

As the second step, the bit values stored in the latches 39–42 are written back into storage elements in adjacent columns, as follows. The Shift Control signals direct the row select generator 46 to either keep asserting or again assert the Select Row 1 signal. The Shift Control signals also direct MUX logic 38 to couple each latch 39–42 to the adjacent bit line to the right. Bit 27 is now coupled to latch 39 and the bit value stored in latch 39 is copied into bit 27. Bit 28 is now coupled to latch 40 and the bit value stored in latch 40 is copied into bit 28. Bit 29 is now coupled to latch 41 and the bit value stored in latch 41 is copied into bit 29. If the Scan Input signal is being used to input data values, then bit 26 is now coupled to the Scan Input signal and the bit value of the Scan Input signal is copied into bit 26. Latch 42 is now coupled to the Scan Output signal and the bit value stored in latch 42 is driven out on the Scan Output signal.

The first and second steps described immediately above are then repeated until all of the bit values in row 1 have been shifted out on the Scan Output signal. By serially shifting out one row at a time, the entire contents of the array of storage elements 22–37 can be scanned out and checked to determine if the array of storage elements 22–37 contains the expected data values. Note that when a bit value is written back into a destination storage element 22–37 from a latch 39–42, the bit value from the latch 39–42 overwrites whatever was previously stored in the destination storage element 22–37.

The operation of the present invention will now be described. Referring to FIG. 2, during normal operation an entire row of storage elements, such as bits 34–37, can be read or written in parallel. These parallel writes and reads during normal operation take place in the same manner as reads and writes to standard memories. An address is received by the row select generator 46. The row select generator 46 then asserts the Select Row signal for the desired row. In the present embodiment, only one Select Row signal is asserted at a time, and thus only one storage element is coupled to each bit line at any given time.

Storage elements 22–25 are part of row 0 and are all selected when the Select Row 0 signal is asserted. Storage elements 26–29 are part of row 1 and are all selected when the Select Row 1 signal is asserted. Storage elements 30–33 are part of row 2 and are all selected when the Select Row 2 signal is asserted. Storage elements 34–37 are part of row 3 and are all selected when the Select Row 3 signal is asserted. In order for MUX logic 38 to be able to couple a storage element to a latch, the Select Row signal for the row containing that storage element must be asserted.

For normal write operations, a multi-bit data value is input in parallel to latches 39–42 using the data input paths. And for normal read operations, a multi-bit data value is output in parallel from latches 39–42 using the data output paths. During both normal read operations and normal write operations, one bit of the data value is stored in each latch 39–42. The Scan Input signal and the Scan Output signal are not used. The Shift Control signals are in a default state indicating that no shift should occur. Thus, each latch 39–42 is coupled to its corresponding bit line during normal read and write operations.

During normal read and write operations, MUX logic 38 couples each latch 39–42 to one storage element 22–37 using the latch's corresponding bit line. Latch 39 has bit line 0 (BL0) as its corresponding bit line; latch 40 has bit line 1 (BL1) as its corresponding bit line; latch 41 has bit line 2 (BL2) as its corresponding bit line; and latch 42 has bit line N (BLN) as its corresponding bit line. Note that only the storage elements in a row which has its Select Row signal asserted can be coupled to latches 39–42.

During scan testing, the Shift Control signals, the Scan Input signal, the Scan Output signal, and the data verification logic 44 are all used in addition to the other circuitry. Note that in an alternate embodiment of the present invention, the Scan Input and Scan Output signals could be bi-directional so that the Scan Input could be received at either end of MUX logic 38 and so that scan shifting could be performed using either right shifts or left shifts. If Scan Input and Scan Output were bi-directional, both Scan Input and Scan Output would be coupled to data verification logic 44 and would be capable of receiving input values.

The Shift Control signals must be provided by test control logic (not shown) to MUX logic 38. MUX logic 38 uses the Shift Control signals to determine which bit line to couple to which latch 39–42. In the illustrated embodiment of the present invention, there is always a one-to-one mapping of the bit lines to the latches 39–42. Other embodiments may use a different mapping scheme. The Select Row signal determines which row of storage elements 22–37 is coupled to the bit lines. Again, in the illustrated embodiment of the present invention, there is always a one-to-one mapping of the storage elements 22–37 in any one row to the bit lines. Other embodiments may use a different mapping scheme. The Shift Control signals thus inform MUX logic 38 as to which latches 39–42 to couple to the selected row of storage elements 22–37. The Shift Control signals also inform MUX logic 38 as to the timing of couplings and data transfers.

The Shift Control signals may also optionally be provided to row select generator 46. If the Shift Control signals are provided to row select generator 46, then row select generator 46 can use the Shift Control signals to determine which row is to be selected next. On the other hand, if the Shift Control signals are not provided to row select generator 46, then row select generator 46 must receive address signals in order to determine which row is to be selected next. The disadvantage to this second approach is that the Shift Control signals being received by MUX logic 38 must be properly synchronized with the corresponding address signal being received by row select generator 46. If the Shift Control signals are used by both MUX logic 38 and row select generator 46, then no such synchronization is required.

The Scan Input signal can be used to serially initialize part or all of the array of storage elements to any desired value. For example, the array can be initialized to all zeros by serially scanning in zero values using the Scan input signal. The Scan Output signal can be used to serially output the contents of one or more storage elements 22-37. In this manner it is possible to output all of the values stored in the array of storage elements 22-37. MUX logic 38 is used to control which storage elements 22-37 will receive the scanned in values and which storage elements 22-37 will supply the scanned out values.

MUX logic 38 may be simple or more complex depending upon the amount of multiplexing flexibility desired. If a very simple scan test capability is desired, MUX logic 38 can be implemented as a set of two-to-one multiplexers where each latch 39-42 can be coupled to only one of two possible bit lines (or two of four possible bit lines if dual bit lines are used). In the simplest implementation, the Shift Control signals would include a signal that selected between one of the two possible bit lines for all of the latches 39-42. For a more complex and flexible implementation, one Shift Control signal could be used for each latch 39-42 to select between one of the two possible bit lines for each latch 39-42.

If a very flexible scan test capability is desired, MUX logic 38 can be implemented so that any bit line can be coupled to any latch 39-42. In this case, MUX logic 38 can be implemented as a set of N N-to-one multiplexers, where N is the number of single bit lines or the number of dual bit line pairs. Thus the bit value stored in any storage element 22-37 could be shifted to any other storage element 22-37.

Note that the multiplexing performed by MUX logic 38 can take place in a variety of possible ways. The multiplexing can be performed on either the incoming data, the outgoing data, or both the incoming and the outgoing data. Thus multiplexing can be performed on: (1) bit values being transferred from storage elements 22-37 to latches 39-42; (2) bit values being transferred from latches 39-42 to storage elements 22-37; or (3) both (1) and (2) above.

If the first option is used, MUX logic 38 can select which bit line to couple to each latch 39-42 when the bit value of a storage element 22-37 is read into an output latch 39-42. However, MUX logic 38 must always couple the same bit line to each latch 39-42 when the bit value of an output latch 39-42 is written back into a storage element 22-37. So for the first option, the multiplexing, and thus the selectability, occurs when bit values are input to latches 39-42 from storage elements 22-37.

If the second option is used, MUX logic 38 can select which bit line to couple to each latch 39-42 when the bit value of an output latch 39-42 is written back into a storage element 22-37. However, MUX logic 38 must always couple the same bit line to each latch 39-42 when the bit value of a storage element 22-37 is read into an output latch 39-42. So for the second option, the multiplexing, and thus the selectability, occurs when bit values are output from latches 39-42 to storage elements 22-37.

If the third option is used, MUX logic 38 can select which bit line to couple to each latch 39-42 regardless of the direction of data transfer between storage elements 22-37 and output latches 39-42. Thus for the third option, the multiplexing, and thus the selectability, occurs when bit values are transferred between latches 39-42 and storage elements 22-37.

An example illustrating the use of the present invention for scan testing will now be described. For purposes of illustration, MUX logic 38 will be assumed to be implemented as a set of N two-to-one multiplexers which can multiplex both inputs and outputs according to the third option described above. Thus each latch 39-42 can be coupled to one of two possible bit lines when receiving or providing a bit value to a storage element 22-37. The Shift Control signals will be used to control the multiplexing of MUX logic 38. Note that the Scan Input signal can be used to input data values into the storage elements 22-37. The Scan Output signal can be used to output data values from the storage elements 22-37.

As the first step, the bit values in one row of storage elements 22-37 are read into latches 39-42, as follows. The Shift Control signals direct the row select generator 46 to assert the Select Row 2 signal. The Shift Control signals also direct MUX logic 38 to couple each latch 39-42 to its corresponding bit line. Bit 30 is now coupled to latch 39 and the bit value stored in bit 30 is copied into latch 39. Bit 31 is now coupled to latch 40 and the bit value stored in bit 31 is copied into latch 40. Bit 32 is now coupled to latch 41 and the bit value stored in bit 32 is copied into latch 41. Bit 33 is now coupled to latch 42 and the bit value stored in bit 33 is copied into latch 42.

As the second step, the bit values stored in the latches 39-42 are written back into storage elements in adjacent columns, as follows. The Shift Control signals direct the row select generator 46 to assert the Select Row 0 signal. The Shift Control signals also direct MUX logic 38 to couple each latch 39-42 to the adjacent bit line to the right. Bit 23 is now coupled to latch 39 and the bit value stored in latch 39 is copied into bit 23. Bit 24 is now coupled to latch 40 and the bit value stored in latch 40 is copied into bit 24. Bit 25 is now coupled to latch 41 and the bit value stored in latch 41 is copied into bit 25. If the Scan Input signal is being used to input data values, then bit 22 is now coupled to the Scan Input signal and the bit value of the Scan Input signal is copied into bit 22. Latch 42 is now coupled to the Scan Output signal and the bit value stored in latch 42 is driven out on the Scan Output signal.

The first and second steps described immediately above are then repeated until all of the bit values in the selected row have been shifted out on the Scan Output signal. The process can then be repeated for all of the rows in the array. Although the example above illustrated that bit values could be read from a first row and then written back to a second row, most scan testing algorithms will use the same row. That is, if values are read from row X, they will be written back to row X in order to prevent the data values in other rows from being overwritten.

Note that in some embodiments of the present invention, the data verification logic 44 may not even be present; the Scan Output signal could be sent directly outside of the array of storage elements and associated logic 18 as the Test Output signal. But if the data verification logic 44 is present, it receives the bit values from the storage elements 22-37 by way of the Scan Output signal. The data verification logic 44 can function in several different ways. The data verification logic 44 could be used to compress the Scan Output data before outputting it as the Test Output signal. The data verification logic 44 could be used to determine if the bit values transmitted by the Scan Output signal were the same as the desired or correct values.

In some implementations of the present invention, there may be signals transferred from data verification logic 44 to row select generator 46. These signals could be used as control signals to indicate to the row select generator 46 that all of the bit values from the presently selected row have been scanned out and that the row select generator 46 should select the next desired row. Such control signals from data verification logic 44 could be used in conjunction with the Shift Control signals to control the timing and assertion of the Select Row signals.

In the present embodiment, storage elements 22-37 both receive signals from and provide signals to combinational logic 20. Other embodiments of the present invention, however, may have more, less, or different connections between the storage elements 22-37 and combinational logic 20. In fact, some embodiments of the present invention may not even have any combinational logic 20.

Because the Scan Input signal allows any desired data value to be stored in storage elements 22-37, any desired data value can be presented as inputs to combinational logic 20 merely by scanning in the data value. And because the Scan Output signal allows any desired data value to be scanned out of storage elements 22-37, any desired output value from combinational logic 20 can be scanned out using the array in order to verify that combinational logic 20 is producing the correct outputs when presented with various selected inputs. In the embodiment of the present invention illustrated in FIG. 2, storage elements 27 and 30 both provide signals to combinational logic 20, and storage element 36 receives signals from combinational logic 20.

In summation, the above specification describes a method and apparatus for shifting data in an array of storage elements 22-37 in a data processing system 10. The present invention is especially useful for scan testing an array of storage elements 22-37 and any associated combinational logic 20.

While the present invention has been illustrated and described with reference to specific embodiments, further modifications and improvements will occur to those skilled in the art. For example, various circuits could be used to implement MUX logic 38. Combinational logic 20 could be virtually any logic circuit. Both the size of the array and the arrangement of rows and columns could be varied. The array of storage elements could be a group of registers. The functionality of the row select generator 46 could be included as part of MUX logic 38.

It is to be understood, therefore, that this invention is not limited to the particular forms illustrated and that it is intended in the appended claims to cover all modifications that do not depart from the spirit and scope of this invention.

We claim:

1. A data processing system, comprising:
an array of storage elements arranged in a first plurality of rows and a second plurality of columns, the array of storage elements having a first storage element located in a first column and having a second storage element located in a second column, the first storage element being coupled to a first bit line and the second storage element being coupled to a second bit line, the first storage element storing a first value;
a latching means for receiving the first value and for storing the first value; and
a logic means for selectively coupling the first storage element to said latching means, for transferring the first value, said multiplexer logic transferring a first data value to said latching means by way of the first bit line when the first storage element is selectively coupled to said latching means, for selectively coupling the second storage element to said latching means, and for transferring the first value to the second storage element by way of the second bit line when the second storage element is selectively coupled to said latching means.

2. A data processing system as in claim 1, wherein the first storage element is decoupled from said latching means before the second storage element is coupled to said latching means.

3. A data processing system as in claim 1, wherein said latching means comprises:
a sense amplifier.

4. A data processing system as in claim 1, wherein said logic means comprises:
a multiplexer.

5. A data processing system as in claim 1, further comprising:
combinational logic coupled to said array of storage elements for receiving a second value from a third storage element.

6. A data processing system as in claim 1, further comprising:
a plurality of control signals coupled to said logic means for selecting which element in said array of storage elements is the first storage element and for selecting which element in said array of storage elements is the second storage element.

7. A data processing system as in claim 1, further comprising:
a serial input conductor, coupled to said logic means, for serially providing input data to said array of storage elements; and
a serial output conductor, coupled to said logic means, for serially outputting output data from said array of storage elements.

8. A data processing system as in claim 7, further comprising:
verification logic, coupled to said serial output conductor, for receiving the output data from said array of storage elements and for providing a test output signal in response thereto.

9. A data processing system as in claim 8, wherein said serial input conductor and said serial output conductor are used for scan testing.

10. A data processing system as in claim 9, wherein the first storage element and the second storage element are located in a same row and adjacent columns.

11. A method for shifting data in an array of storage elements, the array of storage elements being arranged in a first plurality of rows and a second plurality of columns, the method comprising the steps of:
receiving a first row address;
receiving first control signals;
selecting, in response to the first row address, a first one of the first plurality of rows;
selecting, in response to the first control signals, a first storage element located in the first one of the first plurality of rows and in a first one of the plurality of columns;

transferring a value stored in the first storage element to a temporary storage device;

storing the value in the temporary storage device;

receiving second control signals;

selecting a second storage element in response to the second control signals, the second storage element being located in a second one of the plurality of columns; and transferring the value from the temporary storage device to the second storage element.

12. The method according to claim 11, further comprising the step of:

receiving a second row address before said step of transferring the value from the temporary storage device to the second storage element.

13. The method according to claim 12, wherein the first row address and the second row address are identical.

14. The method according to claim 11, further comprising the steps of:

transferring the value to the first storage element from a serial scan test input;

deselecting the first storage element; and deselecting the second storage element.

15. A data processing system, comprising:

an array of storage elements arranged in M rows and N columns;

N latches; and multiplexer logic, coupled between said array of storage elements and said N latches, in response to receiving a first plurality of control signals having a first control value from a first one of the storage elements located in a first one of the N columns to a first one of said N latches, in response to receiving the first plurality of control signals having a second control value, said multiplexer logic transferring the first data value from the first one of said N latches to a second one of the storage elements located in a second one of the N columns.

16. A data processing system as in claim 15, wherein said multiplexer logic has a scan input and a scan output, the data processing system further comprising:

test verification logic coupled to the scan output of said multiplexer logic.

17. A data processing system as in claim 15, further comprising:

row address logic for selecting one of the M rows, said row address logic being coupled to said array of storage elements and being coupled to receive the first plurality of control signals.

18. A data processing system as in claim 15, wherein in response to receiving the first plurality of control signals having the first control value, said multiplexer logic transfers a second data value from the second one of the storage elements to a second one of said N latches, and in response to receiving the first plurality of control signals having the second control value, said multiplexer logic transfers the second data value from the second one of said N latches to a third one of the storage elements located in a third one of the N columns.

19. A data processing system as in claim 18, wherein said multiplexer logic comprises:

N two-to-one multiplexer circuits, wherein each multiplexer circuit is coupled to two of the N columns and is coupled to one of said N latches.

* * * * *